United States Patent [19]
Sperling

[11] Patent Number: 5,917,183
[45] Date of Patent: Jun. 29, 1999

[54] METHOD OF TEMPERATURE COMPENSATION FOR OPTOELECTRONIC COMPONENTS, MORE SPECIFICALLY OPTOELECTRONIC SEMICONDUCTORS

[75] Inventor: Uwe Sperling, Geretsried, Germany

[73] Assignee: BYK-Gardner GmbH, Germany

[21] Appl. No.: 08/809,373

[22] PCT Filed: Sep. 24, 1995

[86] PCT No.: PCT/EP95/03784

§ 371 Date: May 27, 1997

§ 102(e) Date: May 27, 1997

[87] PCT Pub. No.: WO96/09667

PCT Pub. Date: Mar. 28, 1996

[30] Foreign Application Priority Data

Sep. 24, 1994 [DE] Germany .............................. 44 34 266

[51] Int. Cl.$^6$ ........................................................ H01J 7/24
[52] U.S. Cl. ..................................... 250/238; 250/214 C
[58] Field of Search ................................ 250/238, 214.1, 250/214 AL, 214 C; 257/80–84, 432–436

[56] References Cited

U.S. PATENT DOCUMENTS 5,530,433  6/1996  Morita ...................................... 250/573

FOREIGN PATENT DOCUMENTS 516398   12/1992  European Pat. Off. .
23 09 446  7/1976  Germany .

OTHER PUBLICATIONS

Article by J. Mroczka titled Temperature Stabilisation of Light–Emitting Diode Radiation, pp. 306–309, J. Phys. E. Sci. Instrum. 21 (1988). (Month unknown).
Article by Fritz Keiner and Gerhard Krause titled Einfach Schaltung Zum Sliminieren Des Temperaturkoeffizienten Von Lumineszenzdioden, pp. 14–15, Siemens–Bauteile–Informationen 11 (1973). (Month unknown).

*Primary Examiner*—Que T. Le
*Attorney, Agent, or Firm*—Ohlandt, Greeley, Ruggiero & Perle

[57] ABSTRACT

The proposed method of temperature compensation for opto-electronic devices, more specifically opto-electronic semiconductor devices, involves operation of the device under predetermined constant conditions, where a first temperature dependent characteristic value is measured which is then compared with a comparison value determined under identical constant conditions but at a different temperature. A correction function is derived from the relationship between the characteristic value and the comparison value and used to correct the measured value obtained from the semiconductor device so as to compensate for the effect of temperature.

12 Claims, 1 Drawing Sheet

METHOD OF TEMPERATURE COMPENSATION FOR OPTOELECTRONIC COMPONENTS, MORE SPECIFICALLY OPTOELECTRONIC SEMICONDUCTORS

This invention relates to a method of temperature compensation for opto-electronic devices and more specifically for temperature compensation of opto-electronic semiconductor devices.

Opto-electronic devices are devices wherein either electrical energy is converted into light energy or light energy is converted into electrical energy. In modern technology, opto-electronic semiconductor devices have gained particular importance, namely, on the one hand, particularly the light-emitting diodes (LEDs) as light-emitting elements and, on the other hand, photo-diodes, photo-transistors, photo-resistors, photo-thyristors and the like, which sense the intensity of light impinging onto a measuring surface and output a representative electrical signal.

In the following, the method according to the present invention is described by means of an example only with respect to light-emitting diodes to be referred to as LEDs, and with respect to photo-diodes, but it will be understood that it can also be applied to other opto-electronic devices and more specifically to opto-electronic semiconductor devices.

The problem of the application of LEDs and sensor diodes in optical measurement techniques is explained in the following, using color measurements as an example: The color impression which a colored surface provides to an observer is based on a predetermined spectral distribution of the light reflected from said surface which in the eye of the observer is recognized as color. In this respect, the color-sensing function $\psi(\lambda)$ as seen by the observer is given by:

$$\psi(\lambda)=r(\lambda)\cdot S(\lambda)$$

$r(\lambda)$ being representative of the remission spectrum of the surface and $S(\lambda)$ being representative of the spectral distribution of the light impinging onto the surface. In other words, the color-sensing function as seen by the observer is a product of the spectral distribution of the reflection properties of the surface and the spectral distribution of the light impinging onto the surface. A changed spectral distribution of the light impinging onto the surface will result in a changed color impression for the observer.

In technology it is of great importance to correctly detect the color of surfaces, namely, on the one hand in order to reproducibly provide colors and on the other hand in order to correctly reproduce color of surfaces in printing products, films, photographs and by means of electronic devices such as cameras, television screens, computer monitors, and the like.

In conventional color measurements the surface the color of which is to be detected is irradiated with light having an accurately known spectral distribution. The reflected light is spectrally analyzed, for example using a spectral photometer, whereby the spectral reflection properties of the surface and correspondingly the color impression provided by the surface can be computed and can be displayed and compared with normalized color characteristic values.

In order to reduce the apparative efforts for such measurement devices, for some time it has been practiced to irradiate the surface to be measured using LEDs, and to measure the light reflected from said surface using semiconductor sensors, particularly photo-diodes. For example, such a device is disclosed in DE 42 02 822 A1. Therein, a plurality of LEDs arranged on a common substrate as well as a plurality of sensor diodes are used. The problem with these devices, however, is the fact that the spectral characteristics and the intensity of both the LEDs and the sensor diodes is temperature dependent such that the temperature of the LEDs and the sensor diodes has to be detected in order to enhance the measurement accuracy.

In the device mentioned above this is achieved by arranging a temperature sensor on the common substrate. In a control device of the apparatus, a plurality of spectral characteristics for the LEDs and the sensor diodes is stored, and for every measurement first the temperature of the substrate is determined and then the corresponding curve for the analysis of the measurement is selected.

This method firstly comprises the disadvantage that use of a temperature sensor in the measurement device is relatively expensive. Above all, there is the more important disadvantage that it takes a certain period of time until a temperature exchange has taken place in the measurement device such that all semiconductor devices exhibit the same temperature. Particularly, this involves problems because the LEDs warm up during operation. However, until this warming-up of the LEDs has been reliably detected by the temperature sensor, the measuring procedure has already been finished.

It is an object of the present invention to provide a method of temperature compensation for opto-electronic devices and more specifically for opto-electronic semiconductor devices which enables a fast and precise compensation of temperature changes of the semiconductors.

According to the present invention, this object is achieved by the subject matter of claim 1.

Preferred embodiments of the invention are listed in the dependent claims.

BRIEF DESCRIPTION OF THE DRAWINGS

In the following, the present invention will be described with reference to the accompanying drawings, wherein.

DETAILED DESCRIPTION OF THE INVENTION

The present invention will now be explained with respect to the compensation of the temperature dependent drift of light-emitting diodes (LEDs).

According to an alternative of the invention, the LED is operated using a constant current supply. This means that the current supply of the LED is provided with a circuit (known in the state of the art) which generates a predetermined constant current. At the same time, the forward voltage of the LED is measured.

Figure 1:
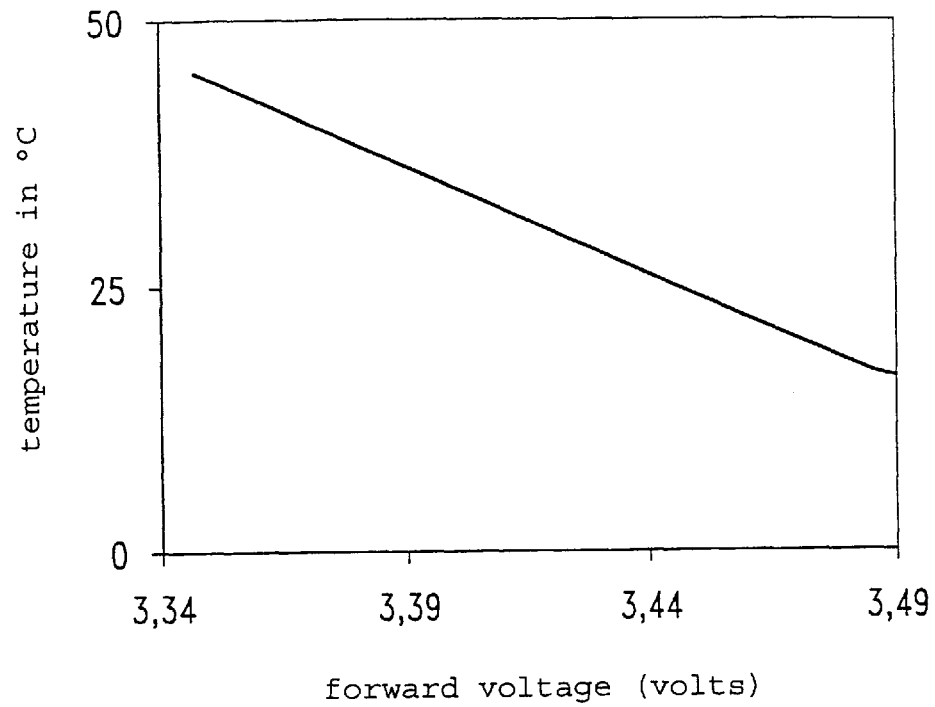
FIG. 1 illustrates the relation between the forward voltage and the environment temperature for the LED, where in the diagram the change of the forward voltage is depicted on the ordinate and the change of the temperature is depicted on the abscissa.

The predetermined current shows a dependence on the forward voltage which depends on the environment temperature and which is graphically illustrated for the range between +10° C. to 40° C. in FIG. 1.

The change of the forward voltage with temperature depends on the respective LED type and generally amounts to 2 to 10 mV per 1° C.

The temperature compensation of the LED is such that every time the LED is activated with a constant current, at the same time the forward voltage is measured. The measuring value of the forward voltage is preferably stored and the spectral characteristics of the LED used for further analysis of the measurement is determined from the measured voltage value. Since the LED warms up during operation, this measurement can reliably take into account the respective temperature, and simultaneously the respective spectral distribution or intensity of the LED can also be detected and taken into account.

Alternatively, the LED can be operated with a constant voltage source and the current can be measured. The corresponding analysis is performed in the same way using the measured current value.

In the following the application of the invention to temperature compensation of sensor diodes is described. Also for the sensor diode the forward voltage depends on the temperature when the sensor diode is operated as a diode, i.e. in forward direction, using a constant current supply. This dependence may be expressed as:

$$U = \frac{K_b}{e} T \cdot \ln\frac{I}{I_o} + U_o \quad (2)$$

$K_b$ is the Boltzmann constant, e is the elementary charge, $I_o$ is the essentially temperature independent current without external field (in equilibrium with the diffusion current), I is the externally applied constant current, $U_o$ is a material dependent offset voltage, and T is the temperature of the semiconductor diode.

At constant current, the temperature coefficient of the sensor diode only depends on material constants. Thus, equation 2 reduces to:

$$U = \alpha \cdot T + C \quad (3)$$

or $$U_x - U_o = \alpha(T_x - T_o) \quad (4)$$

$U_x$ represents the forward voltage of the sensor diode at the constant current and at the temperature $T_x$, $U_o$ represents the forward voltage of the diode at constant current and at temperature $T_o$ (reference temperature), and α represents the temperature coefficient of the sensor diode.

Rearranging this equation results in equation:

$$T_x = \frac{U_x - U_o}{\alpha} + T_o \quad (5)$$

This means that using this equation by means of measuring the forward voltage of the diode, the temperature of the diode can be determined.

The temperature coefficient α can be determined by measuring the forward voltage of the sensor diode at constant current and at different environment temperatures. Since the relation between the change of the forward voltage and the temperature is quite linear, the detection of two points and lying a straight line between these two points appears to be sufficient.

For temperature measurement, i.e. for measuring the forward voltage, the sensor diode is changed from the actual measuring operation which takes place in the reverse direction of the diode and in which the intensity of the light impinging onto the surface is measured, to the forward operation and the sensor diode is supplied with constant current. The forward voltage measured at this time is a measure of the respective temperature and will be taken into account for the analysis of the sensor signal.

The detection of the temperature dependence as explained above can be performed by changing the environment temperature. In the manufacture of optical devices in which such sensor diodes are used, it is quite expensive to detect the temperature dependence for each sensor by varying the environment temperature. Thus, according to the present invention, a method is proposed wherein the dependence of the sensor signal on the temperature may be determined.

In accordance with this method, a sensor is irradiated with a constant light source, being relatively simple to realize in measurement technique.

The diode is operated in measuring condition at the environment temperature $T_o$ prevailing at the starting point, and the sensor signal $S_o$ is measured which provides the sensitivity of the sensor for the constant light source at this environment temperature. Then, the sensor diode is changed into forward operation and operated with a small current $I_o$. For this current, the forward voltage $U_o$ is measured.

Then, the sensor diode is operated with a remarkably higher current in forward direction for a short period of time, this current being selected such that it warms up the sensor diode.

After the warming-up period, again the same small current $I_o$ is used, and the forward voltage $U_1$ is measured. Since the sensor diode now has a higher temperature $T_1$, the forward voltage is lower than the forward voltage $U_o$ for the measurement at the starting temperature $T_o$. Then the diode is changed to the measurement operation, and now the sensor signal $S_1$ for the constant light source is recorded.

Figure 2:
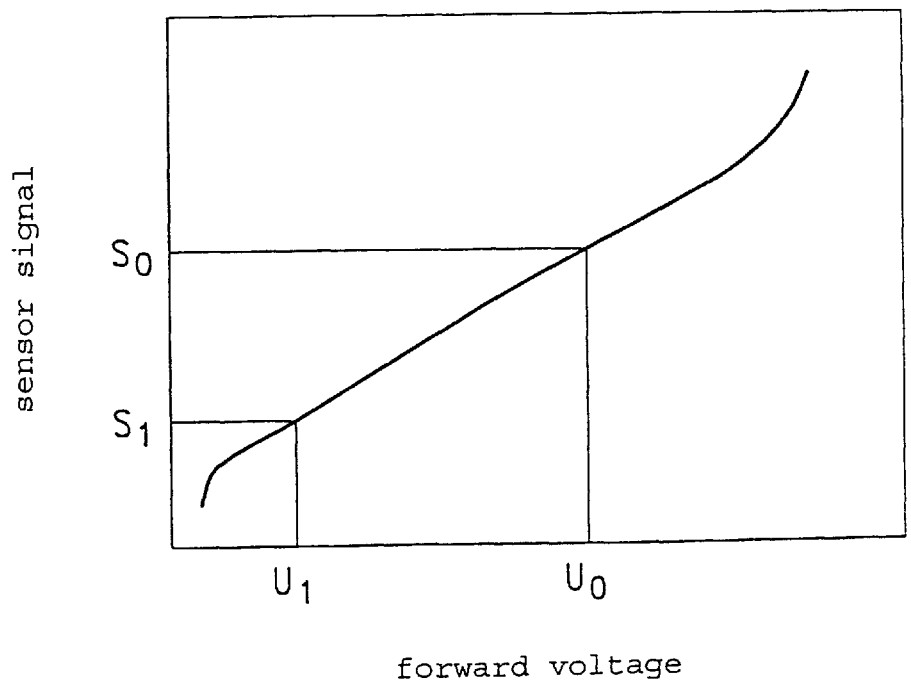
FIG. 2 illustrates the relation between the measured sensor signal of a sensor diode and the forward voltage at the same temperature.

From this measurement procedure, two pairs of values are obtained, namely, the first measured sensor reading $S_o$ at the forward voltage $U_o$ and the second measured sensor reading $S_1$ at the forward voltage $U_1$. Since the change of the forward voltage with temperature is linear, it is possible to put a straight line through these two points as depicted in FIG. 2. This straight line gives the relation between the forward voltage and the sensor reading at the same light intensity. In this respect, the following equation is approximately valid:

$$S_1 = S_o + \alpha(U_1 - U_o) \quad (6)$$

For the temperature coefficient α one obtains:

$$\alpha = \frac{S_1 - S_0}{U_1 - U_0} \quad (7)$$

Consequently, in the measurement according to this embodiment of the inventive method, only the forward voltage has to be determined after recording the respective measurement signal with the constant small current. This forward voltage may be used to correct the measured signal. The method exhibits the major advantage that as correcting quantities directly sensor reading and forward voltage may be used, rather than the value of the temperature which the sensor diodes exhibited when changing the forward voltage. Thereby, a very precise connection between the forward voltage and the sensor signal may be determined without performing possibly unprecise and, due to compensating times, also timely expensive temperature measurements.

In the previously mentioned embodiment, a measurement has been conducted using a constant current.

Alternatively, for a photo diode operated in reverse direction, also a constant voltage supply may be used, in which case instead of the temperature dependent forward voltage, the temperature dependent offset current is measured in the same manner. In this case, also a temperature change may be effected by shortly warming up the diode using a current flowing in forward direction.

Alternatively, in all method alternatives mentioned above, a small heating element may be used for warming up the diode or the corresponding element said heating element being arranged on said sensor diode.

The method also has the advantage that it can be conducted in a very simple manner regarding the measurement technique, which enables use of the method especially in the case when the sensor diodes are already mounted in a corresponding apparatus.

I claim:

1. A method of temperature compensation for opto-electronic devices, particularly for opto-electronic semiconductor devices, characterized in that said devices are operated under predetermined constant conditions and a first characteristic value is measured which is temperature dependent, and that this characteristic value is compared with a comparison value which has been determined under the same constant conditions but at a different temperature, and that from the relation between this characteristic value and this comparison value a correction function is deduced by which the measurement value detected by the semiconductor device is corrected such that the temperature dependence is compensated for.

2. A method of temperature compensation of opto-electronic devices according to claim 1, wherein said predetermined constant condition is a constant current which said devices are operated with.

3. A method according to claim 1, wherein said predetermined constant condition is a constant voltage which is applied to said devices.

4. A method according to claim 1, wherein said semiconductor devices are light-emitting diodes (LEDs), that these constant conditions are a constant current which said LEDs operated with, and wherein this first characteristic value is a forward voltage at which said constant current is measured.

5. A method according to claim 2, wherein said correcting function is determined from a linear relation between said forward voltage and said temperature.

6. A method according to claim 2, wherein said correction function is determined from a non-linear relation between said forward voltage and said temperature.

7. A method according to claim 1, wherein said semiconductor devices are light-emitting diodes (LEDs), and wherein these constant conditions are a constant voltage which said LEDs are operated with, and that said characteristic value is the offset current which is measured at this constant voltage.

8. A method according to claim 1, wherein said opto-electronic devices are semiconductor sensor diodes, and wherein said constant conditions is the current which said sensor diodes are operated with in forward direction, and wherein said characteristic value is the forward voltage measured at said constant current.

9. A method according to claim 8, wherein for detecting the change of its characteristics with temperature, the sensor diodes, respectively is changed from measurement operation taking place in reverse direction of the diodes, respectively into temperature detection operation in forward direction of the diodes, respectively.

10. A method according to claim 8 or 9, wherein said correction value is a light-intensity correction value which is detected by measuring the light intensity of a constant light source, once at a low temperature and once at a higher temperature.

11. A method according to claim 10, wherein said higher temperature of said sensor diodes, respectively is provided by operating said sensor diodes, respectively with a higher current in forward direction for a short period of time.

12. A method according to claim 11, wherein said higher temperature is provided by heating said diodes with a heating element, a resistor or the like.

* * * * *